United States Patent [19]

Kato et al.

[11] Patent Number: 4,660,966
[45] Date of Patent: Apr. 28, 1987

[54] OPTICAL ALIGNMENT APPARATUS

[75] Inventors: Kinya Kato, Tokyo; Kazumasa Endo, Kawasaki, both of Japan

[73] Assignee: Nippon Kogaku K. K., Tokyo, Japan

[21] Appl. No.: 845,637

[22] Filed: Mar. 28, 1986

[30] Foreign Application Priority Data

Apr. 4, 1985 [JP] Japan ................................. 60-71657

[51] Int. Cl.$^4$ ...................... G03B 27/52; G03B 27/70
[52] U.S. Cl. ........................................ 355/43; 355/45; 355/53
[58] Field of Search ..................... 355/43, 45, 53, 60, 355/66; 356/400, 401

[56] References Cited

U.S. PATENT DOCUMENTS 4,402,596  9/1983  Kanatani ............................. 355/43

Primary Examiner—Richard A. Wintercorn
Attorney, Agent, or Firm—Shapiro and Shapiro

[57] ABSTRACT

An optical alignment apparatus with an image-forming optical system for forming an image of an object by means of a light beam and detection means for detecting the position of the object image comprises a collimator lens group for converting the beam coming from said object and having the principal rays intersecting the optical axis into a collimated beam and a condenser lens group for condensing the collimated beam. The condenser lens is so disposed that its optical axis is substantially coincident with the principal ray of the collimated beam from the collimator lens group.

In the optical alignment apparatus, the principal rays of the beam passed through the condenser lens group perpendicularly fall on the focal plane of the condenser lens group, and after passing through the condenser lens group, the principal rays pass through the central area of every optical element.

8 Claims, 4 Drawing Figures

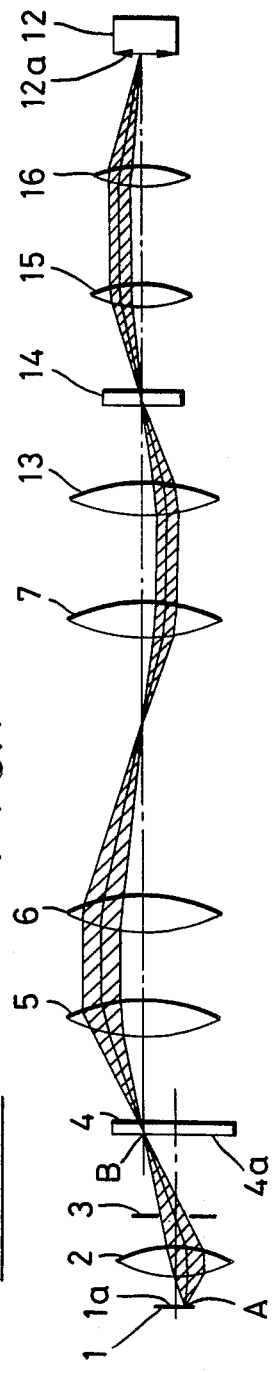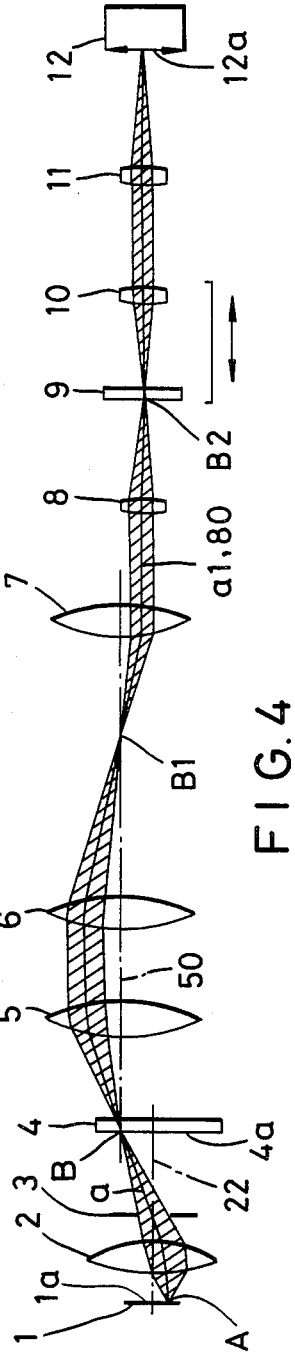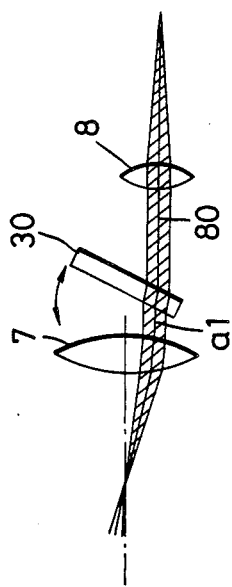

OPTICAL ALIGNMENT APPARATUS

BACKGROUND OF THE INVENTION

1. Field of the Invention

The present invention relates to an optical alignment apparatus adapted for use in the minifying-projection type of exposure system and the like.

2. Related Background Art

The above-mentioned type of optical apparatus has been known and used in the art. For example, such an optical alignment apparatus is disclosed in U.S. Pat. No. 4,402,596 specification. FIG. 1 of the accompanying drawings schematically shows the prior art apparatus in an exploded view of its optical path.

Referring to FIG. 1, the prior art optical alignment apparatus is used to accurately position an object to be exposed such as a wafer 1 relative to a reticle 4. The object 1 has as alignment mark A formed on its patterned surface 1a. The reticle 4 has an alignment reference mark B formed on its patterned surface 1 regarding to a projection objective lens 2. The off-axial rays passing through the alignment mark A and the alignment reference mark B form images on a screen 14 through first and second objective lenses 5 and 6, a collimator positive lens 7 and a focusing lens 13. Further, through first and second objective lenses 15 and 16 of a relay system, the rays form images of the marks A and B also on the image pickup surface 12a of an image-pickup unit 12.

The operator can establish a determined positional relation between the marks A and B by moving the object 1 or the reticle 4 while observing the images of the marks A and B through the image-pickup unit 12. In this manner, an accurate positioning the wafer 1 relative to the reticle 4, that is, an alignment between object and reticle can be achieved.

The prior art optical alignment apparatus as described above, however, some problems which will hereinafter be described.

In the prior art optical alignment apparatus, the first objective lens 5 must be positioned in such a position in which the lens 5 never blocks the exposures light emitted from a light source (not shown) during the time of exposure. The collimator positive lens 7 and the focusing lens 13 are so disposed that their optical axis is coaxial to the first and second objective lenses 5 and 6. The beam of rays passed through the marks A and B enters the marginal area of the first objective lens 5, and the principal rays of the beam passed through the marks A and B are obliquely incident on the screen 14 through the focusing lens 13. Under these conditions, it is not always assured to accurately detect the positions of the marks A and B. If there takes place any change in thickness of the reticle 4 which has the alignment reference mark B on its backside surface, the images of the marks A and B on the screen 14 will be not only blurred but also deviated. Furthermore, when the operator carries out a focusing operation in this state, the images of the marks A and B are shifted on the screen so that it may be no longer possible to accurately detect the positions of the marks A and B. This is the first problem involved in the prior art optical alignment apparatus.

The second problem of the prior art apparatus is found in the fact that it needs a large size of optical system as a whole. As previously mentioned, the beam of oblique rays transmitted through the objective lens 5 passes through the marginal area off the optical axis throughout all the optical elements following the objective lens 5. Therefore, these optical elements are required to have large diameters, which necessarily leads to a large optical system as a whole.

SUMMARY OF THE INVENTION

Accordingly, it is an object of the invention to provide an optical alignment apparatus in which the image of an object can not be deviated on the focal plane even when the object image on the focal plane is blurred or a focusing operation for the object image is carried out.

It is another object of the invention to provide an optical alignment apparatus which enables to detect, always accurately, the position of the image of an object.

It is a further object of the invention to provide an optical alignment apparatus which has a small size of the optical system as a whole.

Other and further objects, features and advantages of the invention will appear more fully from reading the following description.

According to the present invention, the above objects are attained by an optical alignment apparatus with an image-forming optical system for forming an image of an object by means of a light beam and detection means for detecting the position of the object image, said apparatus comprising a collimator lens group for converting the beam coming from said object and having the principal rays intersecting the optical axis into a collimated beam and a condenser lens group for condensing the collimated beam. The condenser lens is so disposed that its optical axis is substantially coincident with the principal ray of the collimated beam from the collimator lens group.

In the optical alignment apparatus according to the invention, the principal rays of the beam passed through the condenser lens group perpendicularly fall on the focal plane of the condenser lens group, and after passing through the condenser lens group, the principal rays pass through the central area of every optical element.

BRIEF DESCRIPTION OF THE DRAWINGS

FIG. 1 is a schematic view illustrating the prior art optical alignment apparatus;

FIG. 3 shows the optical path of the alignment optical system of the apparatus; and FIG. 4 shows a modification of the alignment optical system.

DESCRIPTION OF THE PREFERRED EMBODIMENTS

Figure 2:
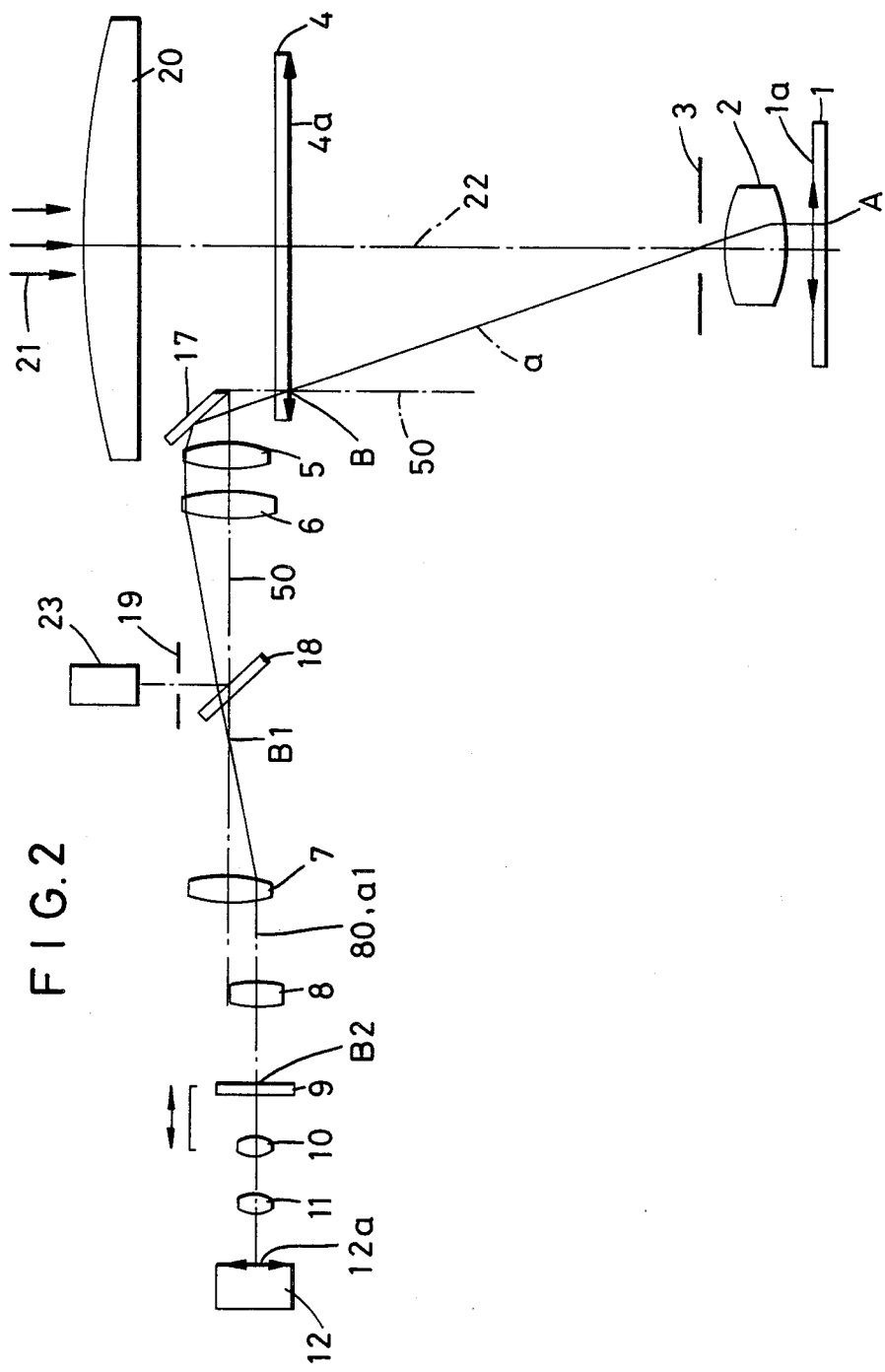
FIG. 2 schematically shows the arrangement of the optical elements of the whole apparatus according to the invention.

Referring to FIG. 2 showing an embodiment of the present invention, the apparatus includes two parts, an exposure optical system and an alignment optical system.

The exposure optical system includes a projection objective lens 2, a main illumination system condenser 20, a light source (not shown) etc. The light source emits an illumination light for exposure 21.

Again, 1 denotes an object to be exposed and 4 does a reticle. The patterned surface 4a of the reticle 4 is disposed conjugate with the patterned surface 1a of the object 1 relative to the projection lens 2. When the pattern surface 4a is illuminated by the exposure illumination light 21, an image of the patterned surface 4a is formed on the patterned surface 1a of the object 1 through the projection objective lens 2.

An alignment mark A is formed an the patterned surface 1a and an alignment reference mark B on the patterned surface 4a. The reference numeral 3 denotes the incidence pupil plane of the projection objective lens 2.

The alignment optical system of the apparatus includes elements 5 to 23, which are, as seen from FIGS. 2 and 3, so arranged as not to interfere with the beam of the exposure illumination light 21 during exposure. In FIGS. 2 and 3, like reference numerals to FIG. 1 represent the same or corresponding elements. As previously mentioned, the object 1 may be, for example, a wafer to be exposed to an IC or LSI circuit pattern or a substrate coated with photo resist such as a coated glass substrate to be exposed to a liquid crystal pattern.

In the alignment optical system, the reflecting mirror 17 receives the oblique beam a passed through the alignment mark A and the alignment reference mark B. The mirror 17 is disposed 45° inclined relative to the optical axis 50 of the first objective lens 5 so that the mirror 17 reflects the oblique beam a toward the marginal area of the lens 5. Since the mirror 17 is 45° inclined, the optical axis 50 intersects the reticle 4 at right angles. Therefore, the optical axis 50 extends eccentrically but substantially parallel to the optical axis 22 of the exposure optical system.

The function of the first objective lens 5 is to convert the beam a into a collimated beam. A second objective lens 6 is behind the first objective lens 5. Disposed between the second objective lens 6 and its rear focal point B1 is a half-mirror 18 (In FIG. 3, this half-mirror 18 is omitted). The half-mirror 18 is disposed inclined relative to the optical axis 50. In order to accommodate the optical system to any change of the position of the alignment reference mark B, the reflecting mirror 17 and the first objective lens 5 are mounted movably together along the optical axis 50.

The beam transmitted through the half-mirror 18 from the second objective lens 6 is collimated by a collimator positive lens 7 disposed on the optical axis 50. The front focal point of the lens 7 is at the above-mentioned point B1.

The collimated beam is focused by a focusing lens 8 positioned behind the collimator lens 7. The optical axis 80 of the focusing lens 8 is coincident with the principal ray a1 of the collimated beam from the lens 7. Thus, the optical axis 80 is eccentric to the optical axis 50. A screen 9 is provided at the rear focal point of the focusing lens 8.

Arranged behind the screen 9 are a relay system comprising first and second objective lenses 10 and 11, and an image pickup unit 12. The image of the marks A, B is refocused on the screen 9 as an image B2. The refocused image B2 is transmitted to the image pickup surface 12a of the image pickup unit 12 through the first and second objective lenses 10 and 11 of the relay system. The first and second objective lenses 11 and 12 of the relay system are arranged coaxially to the optical axis 80. The screen 9 is at the front focal point of the first objective lens 10 of the relay system and the image pickup surface 12a is at the rear focal point of the second objective lens 11. For the purpose of focusing, the screen 9 and the first objective lens 10 can be moved together along the optical axis.

A field stop 19 is provided at a position conjugate with the above-mentioned rear focal point B1 relative to the half-mirror 18. Further, behind the field stop 19 there is an illumination light source for alignment 23. This light source 23 may be, for example, a laser.

The collimating positive lens 7 constitutes a collimator lens group for converting the beam a into a collimated beam a1. The focusing lens 8 constitutes a condenser lens group for condensing the collimated beam a1. The screen 9, the first and second objective lenses 10 and 11 of the relay system and the image pickup unit 12 constitute together a detection means for detecting the position of the image of the marks A, B (object).

The manner of operation of the above shown minifying projection type exposure apparatus is as follows:

At first, the operation of mark positioning by the alignment optical system will be described.

In order to carry out the positioning of the alignment mark A and the alignment reference mark B, the operator turns on the illumination light source for alignment 23 to emit an illumination light. The illumination light passes through the field stop 19 and then falls on the half mirror 18. The illumination light reflected by the half-mirror 18 illuminates the alignment reference mark B through the second and first objective lenses 6 and 5 and the reflecting mirror 17. After that, the illumination light further illuminates the alignment mark A through the projection objective lens 2. Since the illumination light emitted from the light source 23 at first passes through the field stop 19, there is no possibility there other area than the marks A and B may be undesirably illuminated by the illumination light.

An oblique beam a comes back from the illuminated alignment mark A and alignment reference mark B. The oblique beam is reflected by the mirror 17 and then converted into a collimated beam by the first objective lens 5. The collimated beam is concentrated by the second objective lens 6. After passing through the half-mirror 18, the beam forms an image at the rear focal point B1 of the lens 6.

The beam from the rear focal point B1 is converted into a collimated beam a1 which is then refocused on the screen 9 by the focusing lens 8 as a refocused image B2 of the marks A and B.

This image B2 is transmitted to the image pickup surface 12a of the image pickup unit 12 through the first and second objective lenses 10 and 11 of the relay system. Through the image pickup unit 12, the operator can observe the image B2 of the marks A and B.

In order to bring the image B2 into focus, the operator moves the screen 9 and the first lens 10 of the relay system together while observing the marks image B2 through the image pickup unit 12. At the same time, the operator moves the wafer 1 or the reticle 4 until the marks A and B get in a determined positional relation. In this manner, the positioning of the wafer 1 and the reticle 4 can be achieved.

During the above focusing operation, the principal ray of the beam from the focusing lens 8 is perpendicularly incident on the screen 9 so that the image B2 never shifts unfavourably on the screen during the focusing. Therefore, an accurate positioning of the marks A and B can be attained.

Even when the mark image B2 becomes blurred, for example, due to change in thickness of the reticle 4, there is no afraid of image shift of the image B2 of the marks A and B on the screen 9 for the same reason as described above.

Having finished the positioning of the marks A and B in the above manner, the operator starts an exposure operation with the exposure optical system.

An light source (not shown) of the exposure optical system is turned on to emit the illumination light for exposure 21. by this exposure illumination light 21, a minified image of the pattern of the reticle 4 is projected on the pattern of the object 1 through the projection objective lens 2. Thus, the pattern of the reticle 4 is printed on the object 1, for example, on a wafer.

In the above embodiment of the invention, as previously described, the principal ray of the beam a1 emerging from the collimating positive lens 7 passes through not the marginal but the central area of all the following optical elements 8 to 11. This enables to use optical elements 8 to 11 having smaller diameter as compared with the prior art ones. Therefor, the size of the alignment optical system can be reduced to a great extent as a whole.

FIG. 4 shows a modification of the alignment optical system of the above-embodiment.

In this embodiment, a plane parallel plate 30 is additionally provided between the collimating positive lens 7 and the focusing lens 8 to improve the correspondency of the optical axis 80 of the focusing lens 8 to the principal ray a1. According to the modification, a further precise alignment of the optical axis 80 with the principal ray a1 can be achieved through a fine adjustment by changing the inclination of plane parallel plane 30.

Although not shown in the drawings, as another modification, instead of making the optical axis 80 of the focusing lens 8 correspond to the principal ray a1, man can make the optical axis of the second objective lens 6 correspond to the principal ray of the collimated beam from the first objective lens 5 which converts the oblique beam a into a collimated beam, and making the optical axis of the following optical elements 7, 8, 9, 10 and 11 correspond to the optical axis of the second objective lens 6.

In this modified arrangement of the alignment optical system also, the principal ray of the beam from the first objective lens 5 passes through the central area of all the optical elements 6 to 11. Therefore, as the optical elements from the second objective lens 6 to the second relay objective lens 11 there can be used such lenses having smaller diameters than those of the prior art. This modification, therefore, enables to further reduce the size of the alignment optical system as a whole as compared even with the above embodiment. In case of this modification, the first objective lens 5 constitutes the collimator lens group for converting the oblique beam a into a collimated beam. The second objective lens 6 constitutes the condenser lens group for condensing the collimated beam.

While the lens 7 in the above embodiment has been described to convert the beam intersecting the optical axis into a collimated beam, it is to be understood that it is not always necessary for all of the rays of the converted beam to be parallel to each other. The thing necessary for the beam converted by the lens 7 is only that the principal ray of the converted beam should run substantially parallel with the optical axis. The beam converted by the lens 7 may be convergent or divergent provided that its principal ray runs substantially parallel with the optical axis.

Obviously many modifications and variations of the present invention are possible in the light of the above teachings. It is therefore to be understood that within the scope of the appended claims the invention may be practiced otherwise than as specifically shown and described.

What we claimed is:

1. An alignment apparatus for use in an exposure apparatus of the type in which a substrate is exposed to a pattern of a reticle through an exposure optical system, said reticle having a first mark formed thereon whereas said substrate has a second mark disposed substantially conjugate with the first mark relative to the exposure optical system, said alignment apparatus comprising:

an image-forming optical system for forming an image of said second mark by a first beam of light coming from said second mark through said exposure optical system and having its principal ray intersecting the optical axis of said exposure optical system, and for forming an image of said first mark by a second beam of light coming from said first mark and having its principal ray intersecting the optical axis of said image-forming optical system;

detection means for detecting the positions of images of said first and second marks formed by said image-forming optical system on a plane intersecting the optical axis of said image-forming optical system at right angles; and said image-forming optical system comprising a first lens component for converting said first and second beams and a second lens component for transmitting said first and second beams from said first lens component to said detection means, said first and second beam being converted by said first lens component into those beams in which at least principal rays run substantially parallel with the optical axis of said image-forming optical system, and said second lens component being disposed in such a manner that its optical axis substantially correspond to the principal rays of said first and second beams transmitted through the first lens component.

2. Apparatus according to claim 1, wherein said second lens component condenses the beam of light transmitted through the first lens component.

3. Apparatus according to claim 2, wherein said first lens component comprises a collimator lens.

4. Apparatus according to claim 2, wherein said first lens component is so disposed that its optical axis is eccentric to the optical axis of the exposure optical system.

5. Apparatus according to claim 4, wherein said second lens component is so disposed that its optical axis is eccentric to both the optical axis of the first lens component and the optical axis of the exposure optical system.

6. Apparatus according to claim 5, wherein said apparatus further comprises an optical member for parallel moving the beam transmitted through the first lens component.

7. Apparatus according to claim 6, wherein said optical member is a plane parallel plate disposed between said first and second lens components.

8. An apparatus for detecting an image of at least one object through a determined optical system, said detection apparatus comprising:

an image-forming optical system for forming an image of said at least one object by a beam of light coming from said at least one object through said determined optical system and having its principal ray intersecting the optical axis of said determined optical system;

detection means for detecting the position of the image of said object or objects formed by said image-forming optical system on a plane intersecting the optical axis of said image-forming optical system at right angles; and said image-forming optical system comprising a first lens component for converting said beam and a second lens component for transmitting said beam from said first lens component to said detection means, said beam being converted by said first lens component into such a beam in which at least its principal ray runs substantially parallel with the optical axis of said image-forming optical system, and said second lens component being disposed in such a manner that its optical axis substantially correspond to the principal ray of said beam transmitted through the first lens component.

* * * * *